(12) United States Patent
Sakaguchi et al.

(10) Patent No.: US 8,361,694 B2
(45) Date of Patent: Jan. 29, 2013

(54) RESIST UNDERLAYER FILM FORMING COMPOSITION

(75) Inventors: Takahiro Sakaguchi, Toyama (JP); Tetsuya Shinjo, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 466 days.

(21) Appl. No.: 12/450,599

(22) PCT Filed: Apr. 4, 2008

(86) PCT No.: PCT/JP2008/056807
§ 371 (c)(1),
(2), (4) Date: Oct. 2, 2009

(87) PCT Pub. No.: WO2008/126804
PCT Pub. Date: Oct. 23, 2008

(65) Prior Publication Data
US 2010/0035181 A1    Feb. 11, 2010

(30) Foreign Application Priority Data

Apr. 6, 2007   (JP) ................................. 2007-100959

(51) Int. Cl.
*G03F 7/09*    (2006.01)
*G03C 1/825*   (2006.01)

(52) U.S. Cl. ................... 430/271.1; 430/270.1; 430/950
(58) Field of Classification Search ........................ None
See application file for complete search history.

(56) References Cited

U.S. PATENT DOCUMENTS

2007/0190447 A1 * 8/2007 Ogata et al. ................ 430/270.1

FOREIGN PATENT DOCUMENTS

| | | | |
|---|---|---|---|
| DE | 44 33 245 | * | 3/1996 |
| JP | A-11-258796 | | 9/1999 |
| JP | A-2001-215694 | | 8/2001 |
| JP | A-2001-272788 | | 10/2001 |
| JP | A-2004-264709 | | 9/2004 |
| JP | A-2004-264710 | | 9/2004 |
| JP | A-2005-053832 | | 3/2005 |
| JP | A-2005-266798 | | 9/2005 |
| JP | A-2006-227391 | | 8/2006 |
| JP | A-2008-164806 | | 7/2008 |
| WO | WO2005/081061 A1 | * | 9/2005 |
| WO | WO 2008/062888 A1 | | 5/2008 |
| WO | WO 2008/081845 A1 | | 7/2008 |

OTHER PUBLICATIONS

Morita et al ("Characteristics of Field Effect Transistors based on Fullerene Derivatives", Japanese Journal of Applied Physics, vol. 46 (11), 2007, pp. L256-L258).*
Derwent English abstract for DE 44 33 245 A1 (1996).*
Lemiegre, Loie et al. "Synthesis of Oxy Aminated [60] and [70] Fullerenes with Cumene Hydroperoxide as Oxidant." The Chemical Society of Japan. 2007. Chemistry Letters vol. 36, No. 1. pp. 20-21.

* cited by examiner

*Primary Examiner* — Sin J. Lee
(74) *Attorney, Agent, or Firm* — Oliff & Berridge, PLC.

(57) ABSTRACT

It is a problem to provide a resist underlayer film forming composition containing a fullerene derivative, which is easily applied on a substrate and from which a resist underlayer film excellent in dry etching properties can be obtained. The problem is solved by for example a resist underlayer film forming composition comprising: a fullerene derivative represented by Formula (3):

(3)

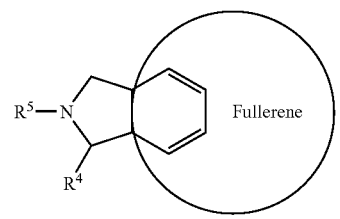

(where, $R^4$ represents one group selected from a group consisting of a hydrogen atom, an alkyl group which optionally has a substituent, an aryl group which optionally has a substituent and a heterocyclic group which optionally has a substituent; and $R^5$ represents an alkyl group which optionally has a substituent or an aryl group which optionally has a substituent); and an organic solvent.

3 Claims, No Drawings

RESIST UNDERLAYER FILM FORMING COMPOSITION

TECHNICAL FIELD

The present invention relates to a composition useful for forming a resist underlayer film provided between a resist film and a substrate in a manufacturing process of semiconductor devices. When a resist underlayer film exhibits an effect of suppressing a reflected wave caused by reflection of an incident wave in a lithography process for the manufacturing of semiconductor devices, the resist underlayer film is termed as an anti-reflective coating.

BACKGROUND ART

Recently, fullerene derivatives having solubility in an organic solvent higher than that of $C_{60}$ fullerene have been synthesized. By using a solution in which such a fullerene derivative is dissolved in an organic solvent, it is possible to form a thin film on a substrate easily. Therefore, research has been done on application of fullerene derivatives to an n-type organic thin film transistor, solar battery, etc.

A synthetic method of a fullerene derivative is described in Non-patent Document 1, for example.

Meanwhile, there is known a technology of forming a resist pattern in a desired shape by providing a resist underlayer film prior to forming a photoresist film in a lithography process when manufacturing semiconductor devices. In Patent Documents 1 to 5, described are compositions for forming a resist underlayer film (anti-reflective coating) containing a fullerene or fullerene derivatives. Such compositions are applied on a substrate and then is cured to form a resist underlayer film (anti-reflective coating).

[Non-patent Document 1]
  Loic Lemiegre et al. "Synthesis of Oxy Aminated (60) and (70) Fullerenes with Cumene Hydroperoxide as Oxidant", Chemistry Letters Vol. 36, No. 1(2007), pp. 20 to 21
[Patent Document 1]
  Japanese Patent Application Publication No. JP-A-2001-272788
[Patent Document 2]
  Japanese Patent Application Publication No. JP-A-2001-215694
[Patent Document 3]
  Japanese Patent Application Publication No. JP-A-2004-264709
[Patent Document 4]
  Japanese Patent Application Publication No. JP-A-2004-264710
[Patent Document 5]
  Japanese Patent Application Publication No. JP-A-2006-227391

DISCLOSURE OF THE INVENTION

[Problems to be Solved by the Invention]
It is an object of the present invention to provide a resist underlayer film forming composition containing a fullerene derivative, which is easily applied on a substrate and from which a resist underlayer film excellent in dry etching properties can be obtained. Particularly, it is an object of the present invention to provide a composition capable of obtaining a resist underlayer film exhibiting high etching resistance (Having a small etching rate) when etching is performed using a gas such as $CF_4$.

[Means for Solving the Problems]
In the present invention, fullerene derivatives soluble in an organic solvent are used. Particularly, used are fullerene derivatives soluble in an organic solvent that has low toxicity, is easy to handle, and is used in a manufacturing process of semiconductor devices, such as propylene glycol monomethyl ether acetate, cyclohexanone and 2-heptanone.

According to a first aspect of the present invention, a resist underlayer film forming composition contains a fullerene derivative represented by Formula (1):

[Chemical Formula 1]

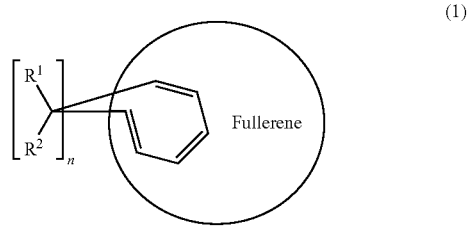

(1)

{where, $R^1$ and $R^2$ independently represent one group selected from a group consisting of an alkyl group which may have a substituent, an ester group [—$COOR^3$ (where, $R^3$ represents an organic group)], an aldehyde group (—CHO) and an aryl group which may have a substituent; and n represents an integer of 1 or more}, and/or
a fullerene derivative represented by Formula (2):

[Chemical Formula 2]

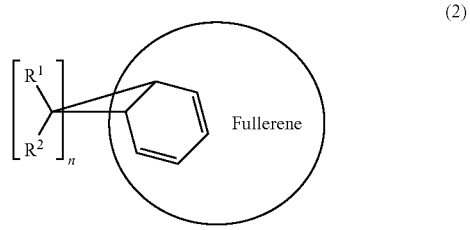

(2)

(where, $R^1$, $R^2$ and n represent the same as those defined in Formula (1)),
in both of which, at least one modifying group is added to one fullerene molecule, and an organic solvent.

In the fullerene derivatives represented by Formulae (1) and (2),
examples of fullerenes include a closed polyhedron cage-type molecule containing carbon atoms in even numbers of 60 or more and having 12 pentagon faces (5-membered rings) and (m/2-10) hexagon faces (6-membered rings) (where, m represents the number of carbon atoms).

In addition, a modifying group added to a fullerene is represented by:

[Chemical Formula 3]

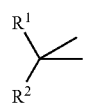

In the modifying group, $R^1$ and $R^2$ independently represent one group selected from a group consisting of an alkyl group which may have a substituent, an ester group [—COOR³ (where, R³ represents an organic group)], an aldehyde group (—CHO) and an aryl group which may have a substituent.

Examples of the alkyl group include a straight chain or branched alkyl group having 1 to 15 carbon atom(s).

Examples of the aryl group include a phenyl group, a naphthyl group and an anthracenyl group.

Examples of a substituent of the alkyl group and the aryl group include a halogen atom, a nitro group, a cyano group, an alkyl group (having 1 to 5 carbon atom(s)), a cycloalkyl group (having 3 to 6 carbon atoms), an alkoxy group (having 1 to 5 carbon atom(s)), an alkylthio group, a hydroxyl group, an amino group, an alkylamino group (having 1 to 5 carbon atom(s)), a formyl group, a carboxyl group, a carbamoyl group, an alkylcarbonyl group (having 1 to 5 carbon atom(s)) and an alkoxycarbonyl group (having 1 to 5 carbon atom(s)). The alkyl group and the aryl group are substituted, for example with 1 to 3 of such substituents.

In addition, examples of the ester group include —COOR³ [where, R³ represents an alkyl group (having 1 to 5 carbon atom(s)) which may have a substituent].

The number (n) of modifying groups added to a fullerene (framework, skeleton) can be 1 or more, for example 1 to 5.

The position at which modifying groups are added to a fullerene (framework, skeleton) is between a 6-membered ring and a 5-membered ring that are adjacent to each other and is between two 6-membered rings that are adjacent to each other, among a plurality of 6-membered rings and 5-membered rings which constitute a fullerene framework (skeleton).

At this time, two carbon atoms between the 6-membered ring and 5-membered ring adjacent to each other or the two 6-membered rings adjacent to each other of the fullerene (framework, skeleton) to which modifying groups are added can take a structure in which the two carbon atoms are bonded through a single bond (see Formula (2)) or a structure in which the two carbon atoms are not directly bonded (see Formula (1)).

In the first aspect, the fullerene derivative represented by Formula (1) takes a structure in which two carbon atoms adjacent to each other of the fullerene (framework, skeleton) to which modifying groups are added, are not directly bonded, and the fullerene derivative represented by Formula (2) takes a structure in which two carbon atoms adjacent to each other of the fullerene (framework, skeleton) to which modifying groups are added, are bonded through a single bond, so that these two fullerene derivatives are in a relationship of constitutional isomers.

In the fullerene derivative represented by Formula (1) or Formula (2), it is possible to adopt as R¹ an aryl group which may have a substituent, and as R² an ester group [—COOR³ (where, R³ represents an alkyl group)] or an alkyl group which may have a substituent.

For example, it is possible to adopt as R¹ a phenyl group, and as R² a group in which one terminal hydrogen atom of a propyl group is replaced by an ester group represented by —COOCH₃ (methoxycarbonyl group).

The resist underlayer film forming composition in the first aspect contains a mixture of a fullerene derivative represented by Formula (1) to which two modifying groups are added and a fullerene derivative represented by Formula (1) to which three modifying groups are added and/or a mixture of a fullerene derivative represented by Formula (2) to which two modifying groups are added and a fullerene derivative represented by Formula (2) to which three modifying groups are added.

The mixture corresponds a mixture of fullerene derivatives respectively represented by Formula (1), in which n represents 2 or 3, or Formula (2), in which n represents 2 or 3.

According to a second aspect of the present invention, a resist underlayer film forming composition contains a fullerene derivative represented by Formula (3):

[Chemical Formula 4]

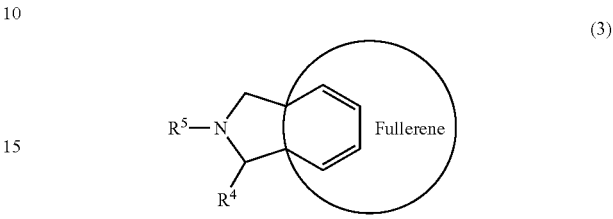

(3)

(where, R⁴ represents one group selected from a group consisting of a hydrogen atom, an alkyl group which may have a substituent, an aryl group which may have a substituent, and a heterocyclic group which may have a substituent, and R⁵ represents an alkyl group which may have a substituent or an aryl group which may have a substituent), and an organic solvent.

In a fullerene derivative represented by Formula (3), examples of the fullerene include the same as that in the first aspect.

In addition, a modifying group added to a fullerene is represented by:

[Chemical Formula 5]

In the modifying group, R⁴ represents one group selected from a group consisting of a hydrogen atom, an alkyl group which may have a substituent, an aryl group which may have a substituent and a heterocyclic group which may have a substituent, and R⁵ represents an all group which may have a substituent or an aryl group which may have a substituent.

Examples of the alkyl group include straight chain or branched alkyl groups having 1 to 15 carbon atom(s).

Examples of the aryl group include a phenyl group, a naphthyl group and an anthracenyl group.

Examples of the heterocyclic group include an unsaturated or saturated heterocyclic ring group containing nitrogen, oxygen and/or sulfur, such as a tetrahydrofuryl group, a pyrrolidinyl group, a pyrazolyl group, an imidazolyl group, a piperidinyl group, a morpholinyl group, a piperazinyl group, a furyl group, a thienyl group, an indolyl group, a thiazolyl group and an isothiazolyl group.

Examples of a substituent of the alkyl group, the aryl group and the heterocyclic group include a halogen atom, a nitro group, a cyano group, an alkyl group (having 1 to 5 carbon atom(s)), a cycloalkyl group (having 3 to 6 carbon atoms), an alkoxy group (having 1 to 5 carbon atom(s)), an alkylthio group, a hydroxyl group, an amino group, an alkylamino group (having 1 to 5 carbon atom(s)), a formyl group, a carboxyl group, a carbamoyl group, an alkylcarbonyl group (having 1 to 5 carbon atom(s)) and an alkoxycarbonyl group (having 1 to 5 carbon atom(s)), and the alkyl group, the aryl group and the heterocyclic group are substituted, for example with 1 to 3 of such substituents.

In the fullerene derivative represented by Formula (3), it is possible to adopt as $R^4$ an alkyl group, and as $R^5$ an aryl group which may have a substituent. For example, it is possible to adopt as $R^4$ an alkyl group having 11 carbon atoms ($C_{11}H_{23}$ group), and as $R^5$ a phenyl group in which one hydrogen atom is replaced by a hydroxyl group (OH group).

According to a third aspect of the present invention, a resist underlayer film forming composition contains a fullerene derivative in which at least one oxygen atom and at least one modifying group represented by Formula (4):

[Chemical Formula 6]

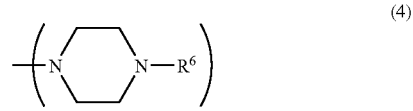

(4)

{where, $R^6$ represents one group selected from a group consisting of a hydrogen atom, an alkyl group which may have a substituent, a carboxyl group, an ester group [—$COOR^7$ (where, $R^7$ represents an organic group)], an aldehyde group (—CHO) and an aryl group which may have a substituent} are added to one molecule of a fullerene, and an organic solvent.

In the third aspect, examples of the fullerene include the same as that in the first aspect.

In addition, in the modifying group represented by Formula (4), $R^6$ represents one group selected from a group consisting of a hydrogen atom, an alkyl group which may have a substituent, a carboxyl group, an ester group [—$COOR^7$ (where, $R^7$ represents an organic group)], an aldehyde group (—CHO) and an aryl group which may have a substituent.

Examples of the alkyl group include straight chain or branched alkyl groups having 1 to 15 carbon atom(s).

Examples of the aryl group include a phenyl group, a naphthyl group and an anthracenyl group.

In addition, examples of the ester group include —$COOR^7$ [where, $R^7$ represents an alkyl group which may have a substituent (having 1 to 5 carbon atom(s))].

Examples of substituents of the alkyl group and the aryl group include a halogen atom, a nitro group, a cyano group, an alkyl group (having 1 to 5 carbon atom(s)), a cycloalkyl group (having 3 to 6 carbon atoms), an alkoxy group (having 1 to 5 carbon atom(s)), an alkylthio group, a hydroxyl group, an amino group, an alkylamino group (having 1 to 5 carbon atom(s)), a formyl group, a carboxyl group, a carbamoyl group, an alkylcarbonyl group (having 1 to 5 carbon atom(s)) and an alkoxycarbonyl group (having 1 to 5 carbon atom(s)). The alkyl group and the aryl group are substituted, for example with 1 to 3 of such substituents.

In the third aspect, it is possible to adopt as $R^6$ of the modifying group represented by Formula (4), an ester group in which $R^7$ represents an alkyl group (alkoxycarbonyl group). For example, as $R^7$ of the ester group, a tert-butyl group can be adopted. As $R^6$ of the modifying group represented by Formula (4), a benzyloxycarbonyl group may be adopted.

The resist underlayer film forming composition in the third aspect contains a mixture of a fullerene derivative in which one oxygen atom and 1 to 4 modifying group(s) represented by Formula (4) are added to one molecule of a fullerene.

The resist underlayer film forming compositions according to the first to third aspects may further contain polymers.

In the first to third aspects, a fullerene serving as a framework (skeleton) of a fullerene derivative is preferably any of $C_{60}$, $C_{70}$ and a mixture containing $C_{60}$ and $C_{70}$. The fullerene may further contain a high-order fullerene having more than 70 carbon atoms.

In the first to third aspects, the organic solvent contains an organic solvent capable of dissolving the fullerene derivative. Examples of such an organic solvent include propylene glycol monomethyl ether acetate, cyclohexanone, 2-heptanone, ethyl lactate, o-xylene, toluene, o-dichlorobenzene, propylene glycol monomethyl ether, propylene glycol monopropyl ether, 1-methyl-2-pyrrolidone and γ-butyrolactone. Then, the mass ratio of the solid content relative to the resist underlayer film forming composition, that is, (solid content)/(resist underlayer film forming composition) can satisfy a range of (1 to 50)/100, for example (1 to 10)/100. In addition, with respect to the solid content in the resist underlayer film forming composition, the mass ratio of a solid content except a fullerene derivative relative to the fullerene derivative, that is, (solid content except fullerene derivative)/(fullerene derivative) can satisfy a range of 100/(1 to 100), for example 100/(10 to 500).

The solid content except a fullerene derivative contains a polymer and may further contain additives (such as a crosslinking agent and a catalyst) other than a polymer. In addition, so long as the resist underlayer film to be formed can obtain desired properties, the resist underlayer film forming composition may contain no polymer and the solid content may be constituted only of a fullerene derivative. When the composition contains besides a polymer, a crosslinking agent and a catalyst, the mass ratio of the crosslinking agent relative to the polymer, that is, (crosslinking agent)/(polymer) can satisfy a range of (10 to 40)/100, for example (15 to 25)/100. In addition, the mass ratio of the catalyst relative to the polymer, that is, (Catalyst)/(Polymer) can satisfy a range of (1 to 4)/100, for example (1.5 to 2.5)/100.

As the polymer, there can be adopted, for example an acrylic resin, a methacrylic resin, a polyester resin, a polyvinylphenol resin, a phenol resin, an amino resin, an urethane resin, a polyimide, a polyamide, a polyamide acid (a polyamic acid) or a polyarylene. In addition, the polymer may have a weight average molecular weight Mw in a range of 1,000 to 100,000.

As the crosslinking agent which is an additive other than the polymer, there can be adopted, for example methoxymethylated glycoluril, butoxymethylated glycoluril, methoxymethylated melamine, butoxymethylated melamine, methoxymethylbenzoguanamine, butoxymethylbenzoguanamine, methoxymethylurea, butoxymethylurea, methoxymethylthiourea or methoxymethylthiourea. In addition, the catalyst accelerates the crosslinking reaction. As the catalyst, there can be adopted, for example acidic compounds such as p-toluenesulfonic acid, trifluoromethanesulfonic acid, pyridinium-p-toluenesulfonic acid, salicylic acid, sulfosalicylic acid (for example, 5-sulfosalicylic acid), citric acid, benzoic acid, hydroxybenzoic acid (3-hydroxybenzoic acid or 4-hydroxybenzoic acid) and naphthalenecarboxylic acid (1-naphthalenecarboxylic acid or 2-naphthalenecarboxylic acid).

The composition may further contain as additives other than the polymer, the crosslinking agent and the catalyst, any one or more of a photoacid generator, a surfactant, a light absorption agent, a rheology controlling agent and an adhesion assistant. The photoacid generator is used to control the acidity near an interface between a resist underlayer film to be formed and a resist. The rheology controlling agent is used to improve the fluidity of a resist underlayer film forming composition. The adhesion assistant is used to improve the adhesion between a resist underlayer film to be formed and an upper layer (resist etc.) or lower layer (substrate etc.) of the resist underlayer film. The surfactant is used to homogeneously apply a resist underlayer film forming composition on a substrate.

As the resist to be formed on the resist underlayer film as the upper layer thereof, both of a negative-type resist and a positive-type resist can be used. Examples of the resist that can be used include: a positive-type photoresist containing a novolac resin and 1,2-naphthoquinonediazide sulfonate ester; a chemical amplification type photoresist containing a binder having a group elevating an alkali dissolving rate by being decomposed by an acid, and a photoacid generator; a chemical amplification type photoresist containing an alkali-soluble binder, a low molecule compound elevating an alkali dissolving rate of a photoresist by being decomposed by an acid, and a photoacid generator; a chemical amplification type photoresist containing a binder having a group elevating an alkali dissolving rate by being decomposed by an acid, a low molecule compound elevating an alkali dissolving rate of a photoresist by being decomposed by an acid, and a photoacid generator; and a photoresist having Si atoms in the framework (skeleton).

In the present specification, Symbol (5) below represents a fullerene (framework, skeleton), that is, a closed polyhedron cage-type molecule containing carbon atoms in even numbers of 60 or more and having 12 pentagon faces (5-membered rings) and (m/2-10) hexagon faces (6-membered rings) (where, m represents the number of carbon atoms).

As the fullerene, particularly preferred are $C_{60}$, $C_{70}$ and a mix of $C_{60}$ and $C_{70}$. Among these 3 types of fullerenes, the mixture containing $C_{60}$ and $C_{70}$ is the lowest in cost.

[Chemical Formula 7]

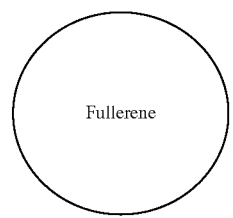

(5)

In the present specification, particularly $C_{60}$ fullerene is represented by a soccer ball-shaped structure such as Formula (6):

[Chemical Formula 8]

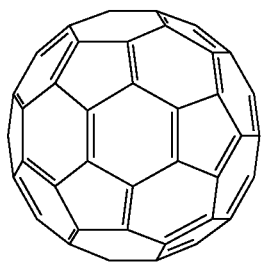

(6)

[Effects of the Invention]

The resist underlayer film forming composition of the present invention is dissolved in an organic solvent, so that it can be easily applied on a substrate. A resist underlayer film formed using the resist underlayer film forming composition of the present invention can achieve the lowering of the etching rate by a gas containing a hydrofluorocarbon (such as $CHF_3$) or a perfluorocarbon (such as $CF_4$), so that it is useful as a hard mask. Moreover, a resist underlayer film formed using the resist underlayer film forming composition of the present invention causes no problem of an intermixing with a resist to be formed on the resist underlayer film and of dissolution of the resist underlayer film in a solvent for a resist. Furthermore, by adding a polymer to a fullerene derivative, the resist underlayer film forming composition of the present invention can reduce the content of an expensive fullerene derivative, as well as form a resist underlayer film exhibiting desired properties.

BEST MODES FOR CARRYING OUT THE INVENTION

Hereinafter, the present invention will be more specifically described referring to Synthesis Examples and Examples which should not be construed as limiting the scope of the present invention.

SYNTHESIS EXAMPLE 1

In a flask, 9.0 g of benzyl methacrylate, 14.5 g of glycidyl methacrylate and 19.0 g of 1-butoxyethyl methacrylate were dissolved in 126 g of cyclohexanone, and then, the inside of the flask was replaced with nitrogen, followed by elevating the temperature thereof to 75° C. After the temperature-elevation, 2.1 g of azobisisobutylonitrile dissolved in 53.2 g of cyclohexanone was added to the resultant reaction mixture in pressurized nitrogen atmosphere and the reaction was effected at 75° C. for 24 hours to obtain a polymer represented by Formula (7). The weight average molecular weight Mw of the obtained polymer was measured and found to be 15,800 (converted into that of polystyrene).

[Chemical Formula 9]

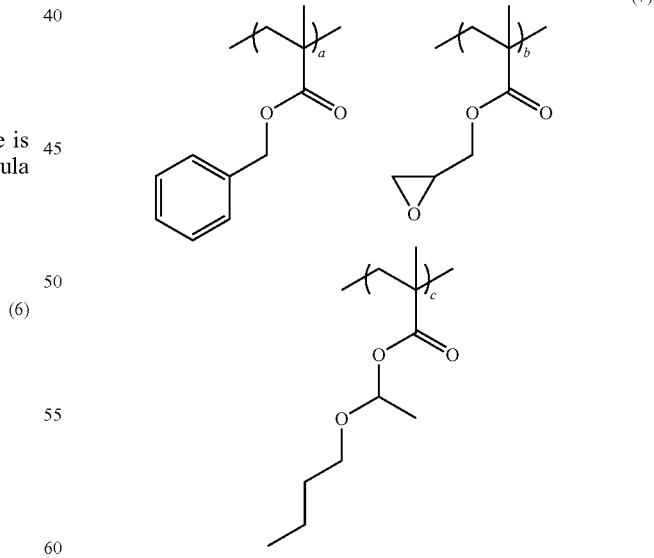

(7)

(where, a:b:c=20:40:40 (in molar ratio))

SYNTHESIS EXAMPLE 2

In chlorobenzene, a commercially available $C_{60}$ fullerene, N-(tert-butyloxycarbonyl)-piperazine and cumenehydroperoxide were mixed and the reaction was effected at room temperature for 24 hours, followed by reprecipitating the resultant product in methanol to obtain a fullerene derivative represented by Formula (8):

[Chemical Formula 10]

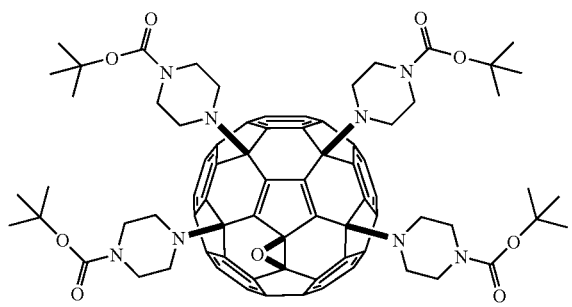

(8)

The fullerene derivative obtained by the present Synthesis Example is a mixture containing, besides a fullerene derivative represented by Formula (8) in which 4 modifying groups having a piperazine derivative are added, a fullerene derivative in which 1 to 3 of the modifying group is(are) added. Instead of obtaining a fullerene derivative by the above method, a fullerene derivative (manufactured by Frontier Carbon Corporation; trade name: nanom spectra J-series) may be obtained to be used. Instead of $C_{60}$ fullerene, $C_{70}$ fullerene may be used. Also may be used a mixture containing $C_{60}$ fullerene, $C_{70}$ fullerene and further a high-order fullerene having more than 70 carbon atoms. By using such a mixture, the cost can be reduced.

EXAMPLE 1

0.4 g of the fullerene derivative obtained in Synthesis Example 2 and a polymer were mixed and as necessary, a crosslinking agent and a catalyst were added in the resultant mixture, followed by dissolving the resultant mixture in an organic solvent. In the present Example, the fullerene derivative was mixed with 10 g of a cyclohexanone solution containing 2 g of a polymer represented by Formula (7), which was obtained in Synthesis Example 1, and the resultant mixture was dissolved in 37.6 g of cyclohexanone to prepare a solution. In the present Example, a crosslinking agent and a catalyst were not used. Subsequently, the solution was filtered using a polyethylene microfilter having a pore diameter of 0.10 μm and further filtered using a polyethylene micro filter having a pore diameter of 0.05 μm to prepare a resist underlayer film forming composition (solution).

EXAMPLE 2

1.0 g of the fullerene derivative represented by Formula (9) (manufactured by Frontier Carbon Corporation; trade name: nanom spectra G100) and a polymer were mixed and as necessary, a crosslinking agent and a catalyst were added in the resultant mixture, followed by dissolving the resultant mixture in an organic solvent In the present Example, a fullerene derivative represented by Formula (9) was mixed with 1.6 g of a polymer represented by Formula (10) (manufactured by Maruzen Petrochemical Co., Ltd.; trade name: CMM30), 0.4 g of hexamethoxymethylolmelamine and 0.04 g of p-toluenesulfonic acid, and the resultant mixture was dissolved in 72.7 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

[Chemical Formula 11]

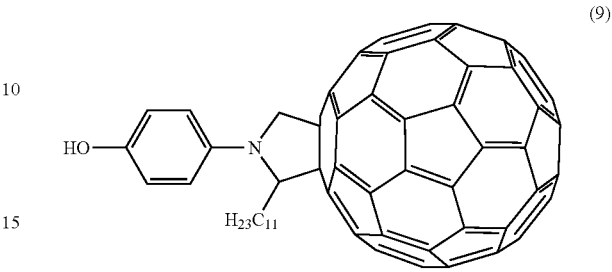

(9)

[Chemical Formula 12]

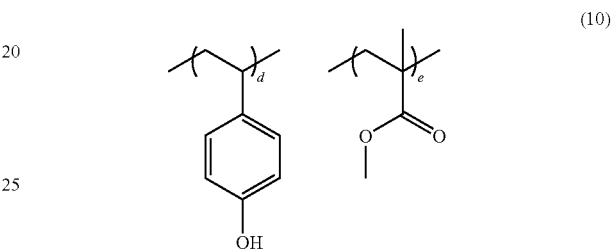

(10)

(where, d:e=30:70 (in molar ratio))

EXAMPLE 3

2.6 g of the fullerene derivative represented by Formula (11) (manufactured by Frontier Carbon Corporation; trade name: nanom spectra E910) and a polymer were mixed and as necessary, a crosslinking agent and a catalyst were added in the resultant mixture, followed by dissolving the resultant mixture in an organic solvent. In the present Example, the fullerene derivative was mixed with 2.0 g of a novolac-type phenolic resin (manufactured by Gunei Chemical Industry Co., Ltd.; trade name: Resitop PSF2803), 0.5 g of hexamethoxymethylolmelamine and 0.05 g of p-toluenesulfonic acid, and the resultant mixture was dissolved in 96.9 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

[Chemical Formula 13]

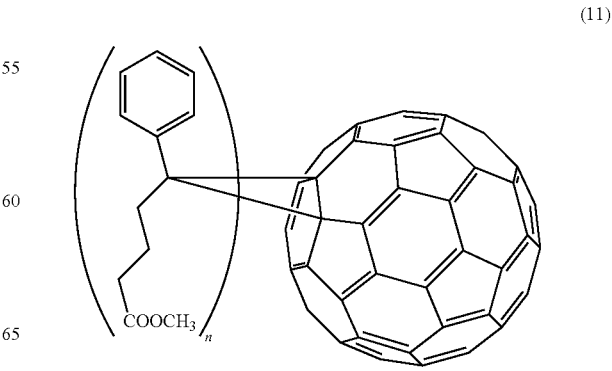

(11)

-continued

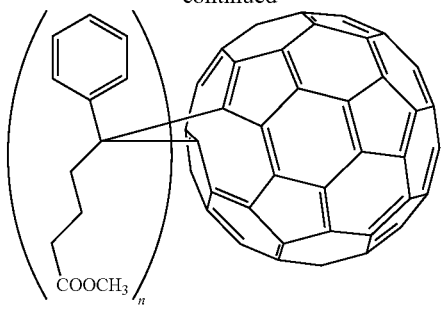

(where, n represents 2 or 3)

EXAMPLE 4

In the present Example, the same fullerene derivative as in Example 2 was used. However, the present Example is different from Example 2 in terms of using no polymer. 2.0 g of a fullerene derivative represented by Formula (9) was dissolved in 38.0 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

COMPARATIVE EXAMPLE 1

The present Comparative Example is different from Example 1 in terms of using no fullerene derivative. 10 g of a cyclohexanone solution containing 2 g of the polymer represented by Formula (7), which was obtained in Synthesis Example 1, was dissolved in 30.0 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

COMPARATIVE EXAMPLE 2

The present Comparative Example is different from Example 2 in terms of using no fullerene derivative. 1.6 g of the polymer represented by Formula (10) (manufactured by Maruzen Petrochemical Co., Ltd.; trade name: CMM30) was mixed with 0.4 g of hexamethoxymethylolmelamine and 0.04 g of p-toluenesulfonic acid and the resultant mixture was dissolved in 38.8 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

COMPARATIVE EXAMPLE 3

The present Comparative Example is different from Example 3 in terms of using no fullerene derivative. 2.0 g of a novolac-type phenolic resin (manufactured by Gunei Chemical Industry Co., Ltd.; trade name: Resitop PSF2803) was mixed with 0.5 g of hexamethoxymethylolmelamine and 0.05 g of p-toluenesulfonic acid and the resultant mixture was dissolved in 48.5 g of cyclohexanone to prepare a solution. Subsequently, the solution was filtered using a polyethylene microfilter having a pore diameter of 0.10 μm and further filtered using a polyethylene microfilter having a pore diameter of 0.05 μm to prepare a resist underlayer film forming composition (solution).

Measurement of Optical Parameter

The solutions of the resist underlayer film forming compositions prepared in Example 1, Example 4, and Comparative Example 1 were applied on silicon wafers using a spinner. Subsequently, the compositions were heated on a hot plate at 240° C. for 2 minutes to form resist underlayer films. In addition, the solutions of the resist underlayer film forming compositions prepared in Example 2, Example 3, Comparative Example 2, and Comparative Example 3 were applied on silicon wafers using a spinner. Subsequently, the compositions were heated on a hot plate at 205° C. for 1 minute to form resist underlayer films.

Then, with respect to these resist underlayer films, the refractive index (value n) and the optical absorption coefficient (value k, referred to also as attenuation coefficient) at wavelengths of 248 nm and 193 nm were measured using a spectro-ellipsometer. The result of the measurement is shown in Table 1.

TABLE 1

|  | Refractive index n (Wavelength: 248 nm) | Optical absorption coefficient k (Wavelength: 248 nm) | Refractive index n (Wavelength: 193 nm) | Optical absorption coefficient k (Wavelength: 193 nm) |
| --- | --- | --- | --- | --- |
| Example 1 | 1.62 | 0.07 | 1.74 | 0.29 |
| Example 2 | 1.69 | 0.18 | 1.50 | 0.37 |
| Example 3 | 1.94 | 0.25 | 1.36 | 0.70 |
| Example 4 | 1.63 | 0.68 | 1.37 | 0.48 |
| Comparative Example 1 | 1.59 | 0.01 | 1.77 | 0.29 |
| Comparative Example 2 | 1.71 | 0.05 | 1.53 | 0.34 |
| Comparative Example 3 | 2.01 | 0.05 | 1.35 | 0.83 |

Dissolution Test in Photoresist Solvent

The solutions of the resist underlayer film forming compositions prepared in Example 1, Example 4, and Comparative Example 1 were applied on silicon wafers using a spinner. Subsequently, the compositions were heated on a hot plate at 240° C. for 2 minutes to form resist underlayer films. In addition, the solutions of the resist underlayer film forming compositions prepared in Example 2, Example 3, Comparative Example 2, and Comparative Example 3 were applied on silicon wafers using a spinner. Subsequently, the compositions were heated on a hot plate at 205° C. for 1 minute to form resist underlayer films.

These resist underlayer films were immersed in solvents (ethyl lactate, propylene glycol monomethyl ether and propylene glycol monomethyl ether acetate) used for a resist and it was confirmed that these films are insoluble in these solvents.

Test for Intermixing with Photoresist

The solutions of the resist underlayer film forming compositions prepared in Example 1, Example 4, and Comparative Example 1 were applied on silicon wafers using a spinner. Subsequently, the compositions were heated on a hot plate at 240° C. for 2 minutes to form resist underlayer films. In addition, the solutions of the resist underlayer film forming compositions prepared in Example 2, Example 3, Comparative Example 2, and Comparative Example 3 were applied on silicon wafers using a spinner. Subsequently, the compositions were heated on a hot plate at 205° C. for 1 minute to form resist underlayer films.

For forming upper layers of these resist underlayer films for lithography, a commercially available photoresist solution (PAR710; manufactured by Sumitomo Chemical Co., Ltd, UVI 13; manufactured by Rohm and Haas Company) was applied on the resist underlayer films using a spinner. Subsequently, the photoresist solution was heated on a hot plate at 90° C. for 1 minute and the resultant photoresist was exposed to light, followed by heating after exposure at 90° C. for 1.5 minutes. The photoresist subjected to the heating after exposure was developed to form a resist pattern and thereafter, the film thickness of the resist underlayer film was measured. It was confirmed that no intermixing occurred between the photoresist layer and the resist underlayer films obtained from the solutions of the resist underlayer film forming compositions prepared in Examples 1 to 4 and the solutions of the resist underlayer film forming compositions prepared in Comparative Examples 1 to 3.

Measurement of Dry Etching Rate

The solutions of the resist underlayer film forming compositions prepared in Example 1, Example 4, and Comparative Example 1 were applied on silicon wafers using a spinner. Subsequently, the compositions were heated on a hot plate at 240° C. for 2 minutes to form resist underlayer films. In addition, the solutions of the resist underlayer film forming compositions prepared in Example 2, Example 3, Comparative Example 2, and Comparative Example 3 were applied on silicon wafers using a spinner. Subsequently, the compositions were heated on a hot plate at 205° C. for 1 minute to form resist underlayer films. Then, the dry etching rates of the resist underlayer films were measured using RIE system ES401 (manufactured by Nippon Scientific Co., Ltd.) under a condition where $CF_4$ was used as a dry etching gas.

Similarly, a photoresist layer was formed on a silicon wafer using the photoresist solution (manufactured by Sumitomo Chemical Co., Ltd.; trade name: PAR710). Then, the dry etching rate of the photoresist layer was measured using RIE system ES401 (manufactured by Nippon Scientific Co., Ltd.) under a condition where $CF_4$ was used as a dry etching gas, and the measured dry etching rate was compared with those of the resist underlayer films formed from the solutions prepared in Examples 1 to 4 and Comparative Examples 1 to 3. The result is shown in Table 2. In Table 2, the dry etching rate ratio represents (dry etching rate of resist underlayer film)/(dry etching rate of photoresist layer).

TABLE 2

| | |
|---|---|
| Example 1 | 0.9 |
| Example 2 | 0.7 |
| Example 3 | 0.6 |
| Example 4 | 0.5 |
| Comparative Example 1 | 1.1 |
| Comparative Example 2 | 1.0 |
| Comparative Example 3 | 0.9 |

From the result shown in Table 2, when comparing Example 1 with Comparative Example 1, Example 2 with Comparative Example 2, and Example 3 with Comparative Example 3, the dry etching rate ratios of Examples (containing fullerene derivatives) are smaller than those of Comparative Examples (containing no fullerene derivative). In addition, the dry etching rate ratio is smaller and the photoresist layer is more likely to be selectively dry-etched in Example 2 (containing a polymer), compared with Example 4 (containing no polymer).

The resist underlayer film forming composition of the present invention can provide a resist underlayer film exhibiting a dry etching rate smaller than that of a photoresist. Furthermore, the resist underlayer film forming composition of the present invention can provide a resist underlayer film capable of also having an effect as an anti-reflective coating.

It was found that in processes including: forming a resist underlayer film on a substrate (such as a silicon wafer); forming a resist pattern on the resist underlayer film; transferring the resist pattern to the resist underlayer film to form a pattern of the resist underlayer film; and processing the substrate by dry etching, the resist underlayer film obtained from the resist underlayer film forming composition of the present invention has a hardmask function.

PRODUCTION EXAMPLE 1 OF SEMICONDUCTOR DEVICE

A resist underlayer film forming composition prepared by any of Example 1 to Example 4 of the present specification is applied on a silicon wafer using a spinner and thereafter, the composition is heated on a hot plate to form a resist underlayer film. With respect to the heating temperature and the heating time, the optimal conditions may be selected from a range of 200° C. to 250° C. and from a range of 1 minute to 2 minutes. On the formed resist underlayer film, a hardmask is formed using a hardmask forming composition containing Si atoms (silicon). Thereon, a photoresist layer is formed using a photoresist solution (manufactured by Sumitomo Chemical Co., Ltd.; trade name: PAR710). The formed photoresist layer containing no silicon is exposed to light through a reticle (photomask) and is developed to form a resist pattern. After the exposure and before the development, the photoresist layer may be heated at a temperature of 100° C. to 150° C. using a hot plate or the like.

Using the resist pattern as a mask and using a gas containing $CF_4$, the hardmask on the resist underlayer film is etched. Furthermore, using a gas containing oxygen, the resist underlayer film is etched. At this time, at least a part of the resist pattern is disappeared. Thus, a pattern having a laminate structure of a resist underlayer film and a hardmask to which a shape of the resist pattern is transferred is formed on the silicon wafer. By using a publicly-known method such as performing dry etching a silicon wafer using a gas containing $CF_4$ following the above process, various semiconductor devices using a silicon wafer can be produced. While dry etching a silicon wafer using a gas containing $CF_4$, a resist underlayer film constituting an underlayer of a pattern having a laminate structure is less prone to be etched, so that it functions as a hardmask.

PRODUCTION EXAMPLE 2 OF SEMICONDUCTOR DEVICE

A resist underlayer film forming composition prepared by any of Example 1 to Example 4 of the present specification is applied on a silicon wafer using a spinner and thereafter, the composition is heated on a hot plate to form a resist underlayer film. On the formed resist underlayer film, a photoresist layer containing silicon is formed using a photoresist solution containing silicon. The formed photoresist layer containing silicon is exposed to light through a reticle (photomask) and is developed to form a resist pattern. After the exposure and before the development, the photoresist layer may be heated at a temperature of 100° C. to 150° C. using a hot plate or the like.

Using the resist pattern as a mask and using a gas containing oxygen, the resist underlayer film is etched. Thus, a pattern having a laminate structure of a resist underlayer film to which a shape of a resist pattern is transferred and a resist pattern containing silicon is formed on the silicon wafer. By using a publicly-known method such as performing dry etching a silicon wafer using a gas containing $CF_4$ following the above process, various semiconductor devices using a silicon wafer can be produced. While dry etching a silicon wafer using a gas containing $CF_4$, a resist underlayer film constituting an underlayer of a pattern having a laminate structure is less prone to be etched, so that it functions as a hardmask.

As described above, the resist underlayer film forming composition of the present invention can be applied to a lithography process during manufacturing of semiconductor devices.

The invention claimed is:

1. A resist underlayer film forming composition comprising:
   a mixture of fullerene derivatives represented by Formula (1):

[Chemical Formula 1]

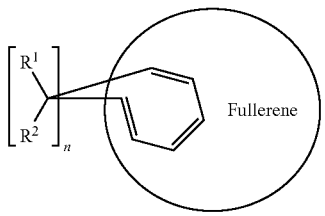

(1)

wherein $R^1$ represents an aryl group which optionally has a substituent, $R^2$ represents an ester group (—$COOR^3$ where, $R^3$ represents an alkyl group) or an alkyl group which optionally has a substituent, and n represents an integer of 2 and 3, respectively; and/or a mixture of fullerene derivatives represented by Formula (2):

[Chemical Formula 2]

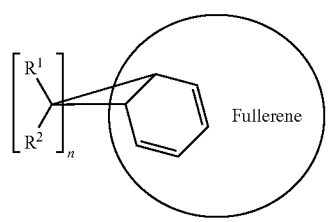

(2)

wherein $R^1$ represents an aryl group which optionally has a substituent, $R^2$ represents an ester group (—$COOR^3$ where, $R^3$ represents an alkyl group) or an alkyl group which optionally has a substituent, and n represents an integer of 2 and 3, respectively;

a polymer;

a crosslinking agent, the mass ratio of the crosslinking agent relative to the polymer satisfying a range of (10 to 40)/100;

a catalyst that accelerates the crosslinking reaction, the mass ratio of the catalyst relative to the polymer satisfying a range of (1 to 4)/100; and an organic solvent.

2. The resist underlayer film forming composition according to claim 1, wherein a fullerene as a framework (skeleton) of the fullerene derivative is any of $C_{60}$, $C_{70}$ or a mixture containing $C_{60}$ and $C_{70}$.

3. The resist underlayer film forming composition according to claim 1, wherein the organic solvent contains an organic solvent capable of dissolving the fullerene derivative.

\* \* \* \* \*